(12) United States Patent
Nanba

(10) Patent No.: US 7,295,282 B2
(45) Date of Patent: Nov. 13, 2007

(54) EXPOSURE APPARATUS, COOLING METHOD, AND DEVICE MANUFACTURING METHOD

(75) Inventor: Hisashi Nanba, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 165 days.

(21) Appl. No.: 10/779,034

(22) Filed: Feb. 13, 2004

(65) Prior Publication Data

US 2006/0007413 A1   Jan. 12, 2006

(30) Foreign Application Priority Data

Feb. 13, 2003 (JP) ............... 2003-035266
Jan. 23, 2004 (JP) ............... 2004-015831

(51) Int. Cl.
*G03B 27/52* (2006.01)
*G03B 27/42* (2006.01)

(52) U.S. Cl. .......................... 355/30; 355/53
(58) Field of Classification Search ................ 355/30, 355/53, 67, 72, 75; 359/820
See application file for complete search history.

(56) References Cited

U.S. PATENT DOCUMENTS

| | | | |
|---|---|---|---|
| 5,638,687 A * | 6/1997 | Mizohata et al. ............. | 62/62 |
| 6,098,408 A | 8/2000 | Levinson et al. | |
| 6,226,073 B1 | 5/2001 | Emoto | |
| 2001/0001248 A1 * | 5/2001 | Emoto ............................ | 355/53 |
| 2001/0038446 A1 * | 11/2001 | Takahashi ..................... | 355/67 |
| 2002/0027000 A1 * | 3/2002 | Nishimura ................... | 165/287 |
| 2002/0027644 A1 | 3/2002 | Bisschops | |

FOREIGN PATENT DOCUMENTS

| | | |
|---|---|---|
| EP | 1286221 A2 | 2/2003 |
| EP | 1353232 A2 | 10/2003 |
| EP | 1387054 A2 | 2/2004 |
| JP | 09092613 | 4/1997 |
| JP | A 9-92613 | 4/1997 |

OTHER PUBLICATIONS

European Search Report, Feb. 23, 2005.

* cited by examiner

*Primary Examiner*—Henry Hung Nguyen
(74) *Attorney, Agent, or Firm*—Morgan & Finnegan LLP

(57) ABSTRACT

Disclosed herein are an exposure apparatus and a cooling method usable therein, being effective to improve a mirror temperature-control precision and to suppress temperature changes in a certain allowable range, particularly in an EUV exposure apparatus. The exposure apparatus includes a chamber having an inside space filled with a vacuum ambience, a subject member disposed in the inside space, the subject member being a member to be temperature-adjusted, a radiation member for temperature-adjusting the subject member without contact thereto, and a temperature adjusting mechanism for temperature-adjusting the subject member, wherein the temperature adjusting mechanism changes the temperature of the radiation member before a heat quantity applied or to be applied to the subject member changes.

6 Claims, 8 Drawing Sheets

EXPOSURE APPARATUS, COOLING METHOD, AND DEVICE MANUFACTURING METHOD

FIELD OF THE INVENTION AND RELATED ART

This invention relates to cooling technology for an optical member placed in a vacuum environment in an exposure apparatus and, more particularly, to radiational cooling technology to such location where thermal load applied to an optical member changes as like on/off action, such as exposure heat.

Conventional exposure apparatuses use an ultra-high pressure Hg lamp (i-line), a KrF excimer laser or an ArF excimer laser. With the light of these wavelengths, exposures can be performed in a gas ambience. Thus, the cooling method for cooling optical elements is based on convection by blowing a gas thereto, or circulation of a cooling medium.

The wavelength of exposure light used in exposure apparatuses has recently been shortened more and more to meet further miniaturization of semiconductor integrated circuits. Currently, use of extreme ultraviolet (EUV) light as exposure light is predicted. Regarding the wavelength of such EUV light, the energy is attenuated largely in a gas ambience. Also, with the exposure in a gas ambience, carbon compound is deposited on an optical element. Because of these reasons, the exposure with EUV is performed in a vacuum environment.

Use of EUV as a light source necessitates exposure in a vacuum ambience, and this makes it difficult to accomplish temperature adjustment. Particularly, in a vacuum ambience, it is impossible to cool a surface of an object by means of convection, as conventional. Furthermore, the temperature adjustment based on flow of a cooling medium will cause vibration, which undesirably leads to degradation of the transfer positional precision. Japanese Laid-Open Patent Application No. H09-092613 proposes a non-contact cooling method in a vacuum ambience, wherein cooling is executed on the basis of radiation.

In such radiation cooling, a subject member to be cooled is cooled by use of a radiation plate. The radiation plate is specifically arranged to provide a large radiation coefficient at its surface to enlarge the radiation heat transfer amount, such as roughening the surface, or applying a material having large radiation coefficient to the surface. The radiation plate is disposed opposed to the surface of the subject member that is to be cooled, without contact thereto. A heat flux is thus produced between the radiation plate and the surface opposed to the radiation plate, whereby the subject member to be cooled is cooled.

Regarding the heat quantity as a substance Y having an absolute temperature $T_2$ [K] and an area $A_2$ [m²] absorbs from a substance X having an absolute temperature $T_1$ [K] and an area $A_1$ [m²], where the radiation coefficient of the substance X is $E_1$, the radiation coefficient of the substance Y is $E_2$, and the radiation geometric factor (the rate of the energy impinging on the substance Y to the energy emerging from the substance X) is $F_{12}$, the heat flux density Q [W/m²] between two planar plates can be expressed by the following equation (where $T_1 > T_2$):

$$Q = \sigma(T_1^4 - T_2^4)/(1 - E_1)/(E_1 A_1) + (1/(A_2 F_{12})) + (1 - E_2)/(E_2 A_2))$$

wherein $\sigma$ is Stefan-Boltzmann constant.

If, for example, two disks having a diameter 100 mm are disposed in parallel to each other with a distance 10 mm and if the two disks have the same radiation coefficient of 0.8, in order to produce a heat flux of 0.5 W, where one disk has a temperature 23° C., the temperature of the other disk has to be lowered to about 0° C. It is seen from this that, in order to obtain a large heat transfer quantity (a few watts to more than ten watts) on the basis of radiation, the surface area through which two objects are opposed to each other has to be enlarged or, alternatively, a large surface temperature difference should be defined between the two objects. However, there is a limitation to enlargement of the surface area of opposed surfaces and, for this reason, it becomes very important to produce a large surface temperature difference between the two objects.

Where the heat load changes suddenly as like an on/off operation, the temperature of the radiation plate has to be changed quickly to follow it. In the example described above, where two disks having a diameter 100 mm and a temperature 23° C. are disposed in parallel to each other with a distance 10 mm and they have the same radiation coefficient of 0.8, if a heat load of 0.5 W is applied as "on" to one disk (stepwise application of heat load of 0.5 W), in order to keep this disk at 23° C., it is necessary to change the temperature of the other disk quickly from 23° C. to 0° C. However, the radiation plate has a certain heat capacity and, thus, it is difficult to change the temperature of the radiation plate so quickly to follow the change in the heat load. As a result, there occurs a lag in control, and a tolerable temperature variation range of the optical member is easily exceeded. It is therefore necessary to improve degradation of the control precision resulting from such control delay.

Since EUV exposure apparatuses are used for exposure of a circuit pattern of a linewidth of 0.1 micron or smaller, the linewidth precision is very strict. Particularly, as regards the mirror surface shape, only a deformation of about 0.1 nm is tolerated. Thus, while the mirror is generally made of a low thermal-expansion glass material, since such low thermal-expansion glass is very soft, the thickness of the mirror is made very large to avoid easy deformation of the surface shape thereof due to any external force. This means that the mirror has a large heat capacity, such that there occurs a time lag until a temperature sensor can detect application of heat as a temperature rise. This causes a delay of control and degradation of control precision.

SUMMARY OF THE INVENTION

It is accordingly an object of the present invention to provide an exposure apparatus, a cooling method and/or a device manufacturing method, by which degradation of temperature control precision due to a delay of control can be improved such that temperature variation can be held within a tolerable range.

In accordance with an aspect of the present invention, there is provided an exposure apparatus, comprising: a chamber having an inside space filled with a vacuum ambience; a subject member disposed in said inside space, said subject member being a member to be temperature-adjusted; a radiation member for temperature-adjusting the subject member without contact thereto; and a temperature adjusting mechanism for temperature-adjusting the subject member, wherein said temperature adjusting mechanism changes the temperature of the radiation member before a heat quantity applied or to be applied to the subject member changes.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

First Embodiment

Figure 1:
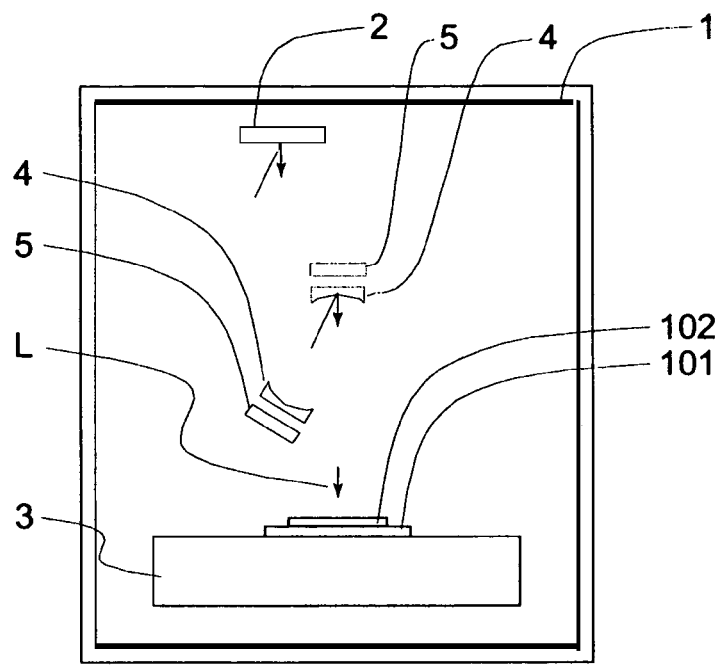
FIG. 1 is a schematic view of an exposure apparatus according to an embodiment of the present invention.

FIG. 1 is a schematic view for explaining an example of exposure apparatus based on a cooling method, according to a first embodiment of the present invention. Denoted at 1 is a chamber which functions to separate an exposure ambience from an atmosphere. A vacuum is maintained in the chamber, by means of a pump, not shown. Exposure light L directed from an unshown illumination optical system is reflected by a reticle 2. The exposure light L as reflected by the reticle 2 is reflected by mirrors of a projection optical system and projected upon a wafer 102, whereby a pattern of the reticle 2 is transferred to the wafer 102. Wafer 102 is in a wafer chuck 101 mounted on a block 3. There is a radiation cooling mechanism 5 disposed opposed to the bottom face of the mirror 4.

Figure 2:
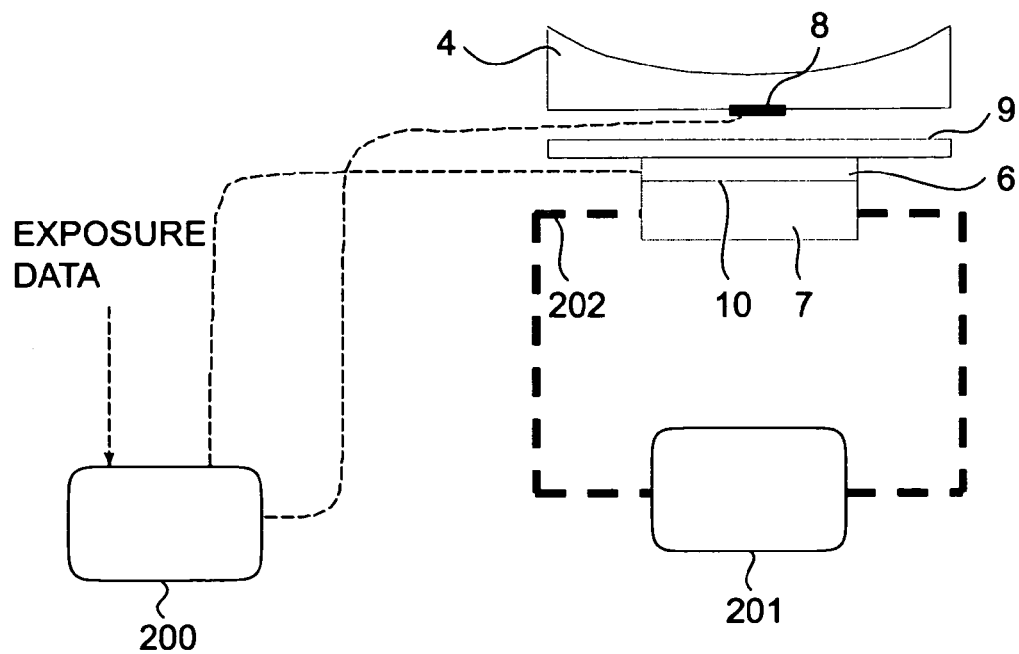
FIG. 2 is a schematic view of a radiation cooling mechanism according to an embodiment of the present invention.

FIG. 2 is a schematic view of the radiation cooling mechanism. The radiation cooling mechanism 5 comprises a Peltier device 6, a heat radiating (dissipation) block 7, and a radiation plate 9. The Peltier element 6 includes, for example, p-type semiconductors and n-type semiconductors disposed thermally in parallel to each other. The Peltier device 6 is controlled by a controller (to be described later) and, as joined with the radiation plate 9, it functions to cool the radiation plate 9 on the basis of Peltier effect. The term "Peltier effect" refers to a phenomenon that, in response to a flow of electric current to a contact between two types of conductors or semiconductors, transfer of heat occurs due to a difference in electric conductivity. In this embodiment, the Peltier device 6 is provided by p-type semiconductors and n-type semiconductors. Since electrons do not easily flow in the region from p-type semiconductor to n-type semiconductor, it provides a heat absorbing surface. In the region from n-type semiconductor to p-type semiconductor, on the other hand, since electrons easily flow, it provides a heat radiating surface 10 that emits heat. Thus, by joining the heat absorbing surface of the Peltier device 6 to the radiation plate 9, heat can be absorbed from the radiation plate 9 and it can be cooled thereby. The heat quantity that can be absorbed by the Peltier device can be adjusted by changing the applied electric voltage across the device.

The heat radiating block 7 is joined to the heat radiating surface 10 of the Peltier device. The heat radiating block 7 is connected to a circulation means 201 through a flowpassage 202. By circulating a fluid through the flowpassage 202, the heat radiating surface 10 of the Peltier device 6 can be cooled. For enlargement of radiation heat transfer amount, the surface of the radiation plate 9 has been processed to provide a radiation coefficient of 0.8 or more or, alternatively, a material having a radiation coefficient not less than 0.8 has been adhered to the surface. The mirror 4 is provided with a temperature sensor 8 for measuring the temperature of the mirror 4. The temperature sensor 8 is connected to a temperature controller 200.

The circulation means 201 comprises a pump and a temperature adjustor, and the temperature controller 200 performs control to maintain a predetermined constant temperature at the location of the temperature sensor 8. The Peltier device 6 is connected to the temperature controller 200, and the temperature controller 200 provides an output to the Peltier device 6 so as to hold the value of the temperature sensor 8 constant. Further, the temperature controller 200 is connected to a computer for storing exposure data, and it can access the exposure data.

The exposure light L incident on the mirror 4 is reflected thereby, and it reaches the wafer 102. However, a portion of the exposure light L is absorbed by the mirror 4, such that the temperature of the mirror 4 rises. Thus, the mirror 4 should be cooled. For high-precision cooling of the mirror 4, active cooling should be done, as will be described later.

The exposure light L changes as like on/off operation, and thus the heat load applied to the mirror 4 changes as like on/off operation. Where the heat load changes suddenly as like on/off, the temperature of the radiation plate 9 must be changed quickly to follow it. However, since the radiation plate 9 has a heat capacity, it is difficult to change the temperature of the radiation plate 9 so quickly to follow the change in the heat load. Furthermore, while the mirror 4 is made of a low thermal-expansion glass material, since such low thermal-expansion glass is very soft, the thickness of the mirror is made very large to avoid easy deformation of the surface shape thereof due to any external force. This means that the mirror 4 has a large heat capacity, such that there occurs a time lag until the temperature sensor can detect application of heat as a temperature rise. This causes a delay of control and degradation of control precision. As a result, the control is delayed, and the tolerable temperature variation range for the mirror is easily exceeded.

Figure 3:
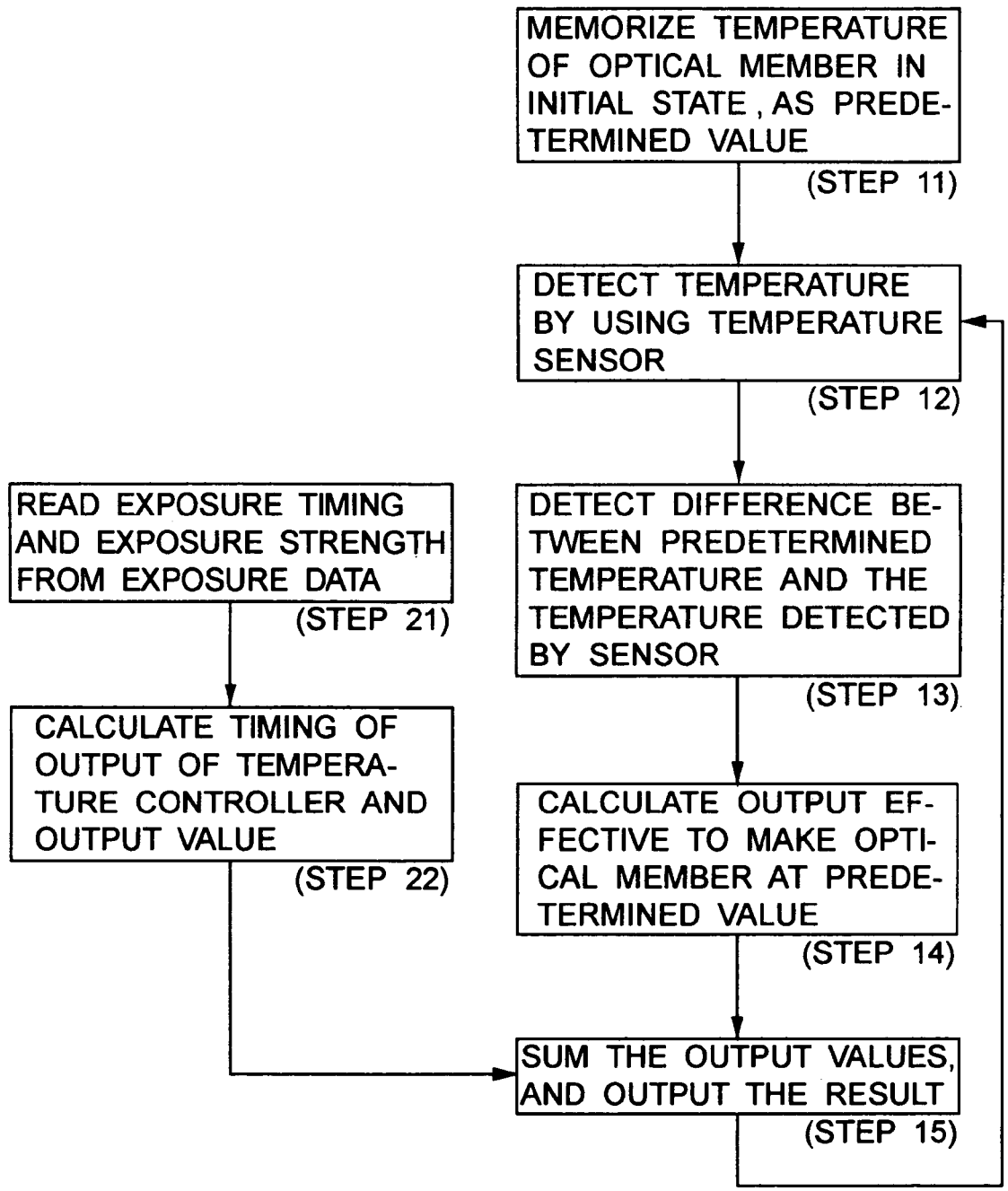
FIG. 3 is a flow chart for explaining temperature control procedure for an optical member, in an embodiment of the present invention.

These inconveniences can be solved as follows. That is, if the timing and magnitude of the heat load to be applied to the mirror 4 is predetected, the temperature of the radiation plate can be changed beforehand. This makes it possible to effectively reduce the temperature variation. FIG. 3 illustrates the procedure of temperature control, based on it.

At step 11 in FIG. 3, the temperature controller 200 memorizes the temperature of the mirror 4 in its initial state, as a predetermined temperature.

At step 21, the exposure timing and the exposure light strength is read out from the exposure data.

At step 22, the temperature controller 200 calculates the output timing and the output level in accordance with the data read out at step 21. Here, the output timing and the output magnitude of the temperature controller 200 to the heat load may be stored beforehand as a function, on the basis of simulations or experiments. In that occasion, the output timing and the output level can be calculated from the exposure timing and exposure light strength. Alternatively, on the basis of simulations or experiments, the output timing and output magnitude to head load may be stored in a table. In that occasion, by interpolating values in the table, the output timing and output level can be calculated on the basis of the exposure timing and the exposure light strength.

If no output is required, 0 (zero) is taken for the output level.

At step 12, the temperature of the mirror 4 is detected by use of the temperature sensor 8.

At step 13, any changes in the difference between the temperature of the mirror 4 detected at step 12 and the predetermined temperature as memorized at step 11, is detected.

At step 14, the temperature controller 200 calculates an output so that the mirror 4 is adjusted to the predetermined temperature.

At step 15, the temperature controller 200 applies an output to the Peltier device 6, the output corresponding to the sum of the output levels at steps 14 and 22.

The sequence then goes back to step 12.

Now, an example wherein the heat load is going to be "on" will be considered.

The temperature of the mirror 4 may otherwise rise beyond a tolerable range, due to the delay of control. Since, however, the timing and the strength of exposure light heat application can be predetected at step 21, the output of the temperature controller can be determined appropriately in accordance with the procedure at steps 12, 13 and 14. Thus, before the exposure light heat is applied, a signal for lowering the temperature of the radiation plate 9 can be applied to decrease the temperature of the radiation plate 9. As a result, the temperature variation of the mirror 4 can be reduced, and it can be maintained within a required tolerable temperature variation range.

Figure 4:
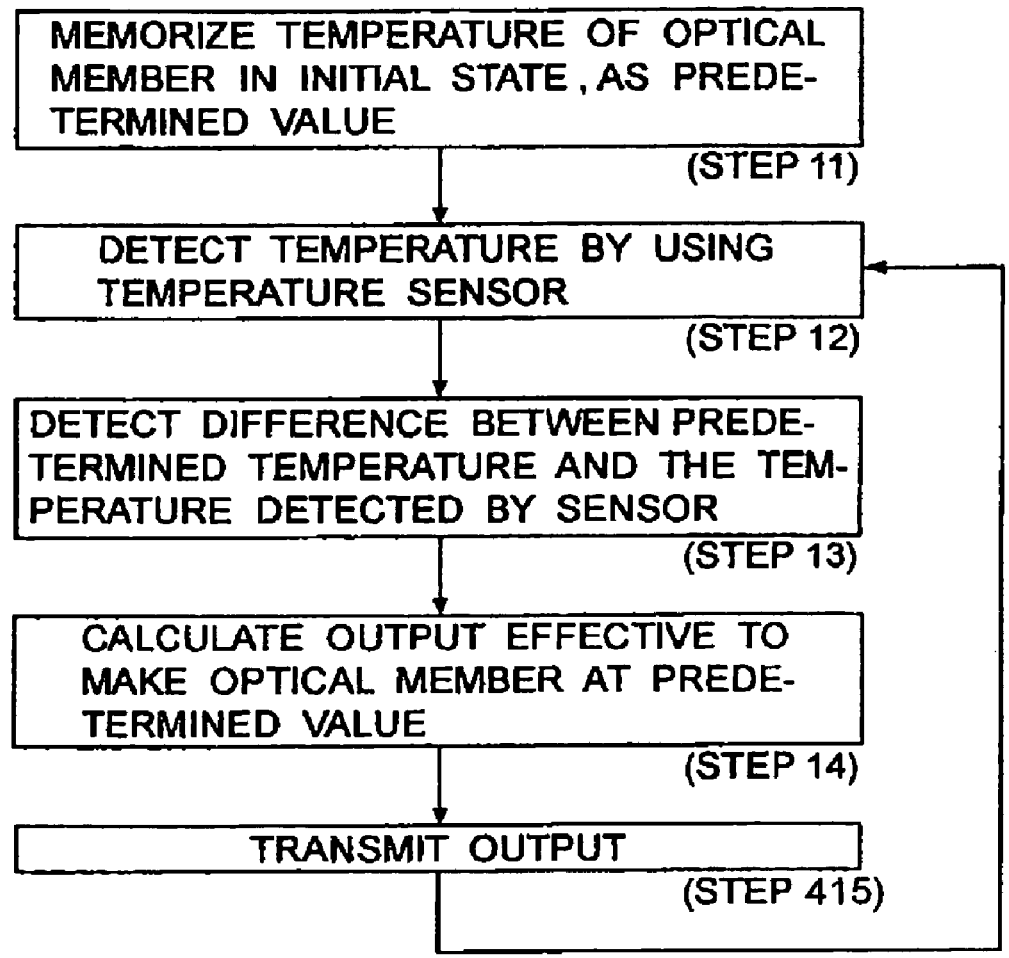
FIG. 4 is a flow chart for explaining conventional temperature control procedure.

FIG. 4 illustrates a conventional (normal) temperature controlling procedure. Common steps in the procedures shown in FIGS. 3 and 4 have the same step number. Step 415 in the flow chart shown in FIG. 4 differs from step 15 in the flow chart shown in FIG. 3 because of the additional steps in the temperature control procedure shown of FIG. 3.

Figure 5:
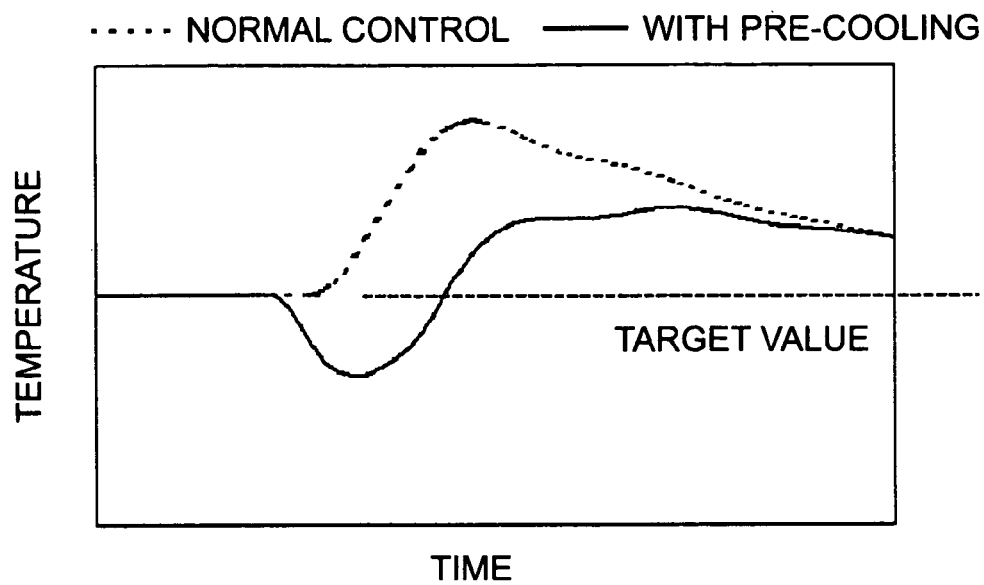
FIG. 5 is a graph for explaining an example of temperature control in radiation cooling according to an embodiment of the present invention.

FIG. 5 is a graph showing the results of comparison between the temperature variation as controlled in accordance with the temperature controlling procedure of the present invention shown in FIG. 3, and the temperature variation as controlled in accordance with the conventional (normal) temperature controlling procedure shown in FIG. 4. In the examples shown in FIG. 5, the temperature control was performed to application ("on") of heat load of the same magnitude. It is seen from FIG. 5 that, as compared with the control according to the conventional control procedure (FIG. 4), the temperature variation with regard to a target temperature (target value) is reduced to about a half in accordance with the temperature control procedure of FIG. 3.

Second Embodiment

Figure 6:
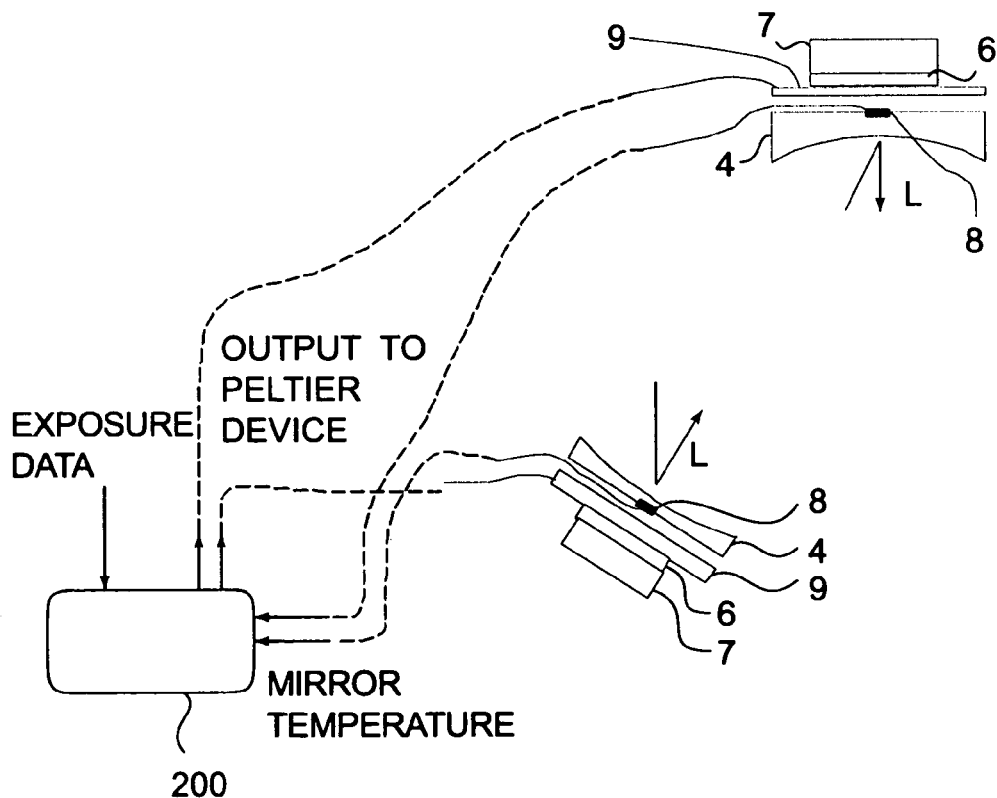
FIG. 6 is a schematic view for explaining plural radiation cooling mechanisms and a temperature controller, in an embodiment of the present invention.

A second embodiment of the present invention concerns a cooling method wherein every mirror is cooled in accordance with the procedure shown in FIG. 3. More specifically, as shown in FIG. 6, mirrors may have different shapes. Also, heat loads applied to the mirrors may be different from each other. Thus, the timing for changing the temperature of the radiation plate 9 to be calculated by step 22 may differ between the mirrors. In consideration of it, in accordance with the present embodiment, with respect to each of plural mirrors, a function or a table that represents the output timing and the output level to heat loads, to be used at step 22, is prepared. With this arrangement, a signal can be applied at an optimum timing in relation to each mirror. Thus, in regard to all the mirrors, the temperature can be controlled with good precision, within a tolerable temperature variation range.

While the foregoing embodiments have been described specifically with respect to a cooling method, the invention is not limited to this. The invention can be applied to an exposure apparatus having a cooling method (a cooling mechanism or a cooling system) incorporated therein. Alternatively, the invention can be applied to a device manufacturing method that includes a step for exposing a substrate (a workpiece to be exposed or a wafer) by use of such exposure apparatus, and a step for developing the exposed substrate.

Further, the exposure apparatus as described above may be provided with storing means for memorizing exposure program (including various information about exposure start timing, exposure completion timing, timing for changing exposure light quantity, exposure light quantity as changed, and so on) for exposure of wafers. In that occasion, the heat quantity to be applied to each optical elements (mirrors) and the timing of heat quantity application can be predetected on the basis of the stored information. By performing optimum temperature adjustment to each optical element (mirror) on the basis of the information obtained therefrom, the temperatures of the optical elements can be maintained within a tolerable temperature variation range. The storing means mentioned above may not be provided in the exposure apparatus, but rather the cooling system (cooling means) may include such storing means (memorizing step).

Third Embodiment

Figure 7:
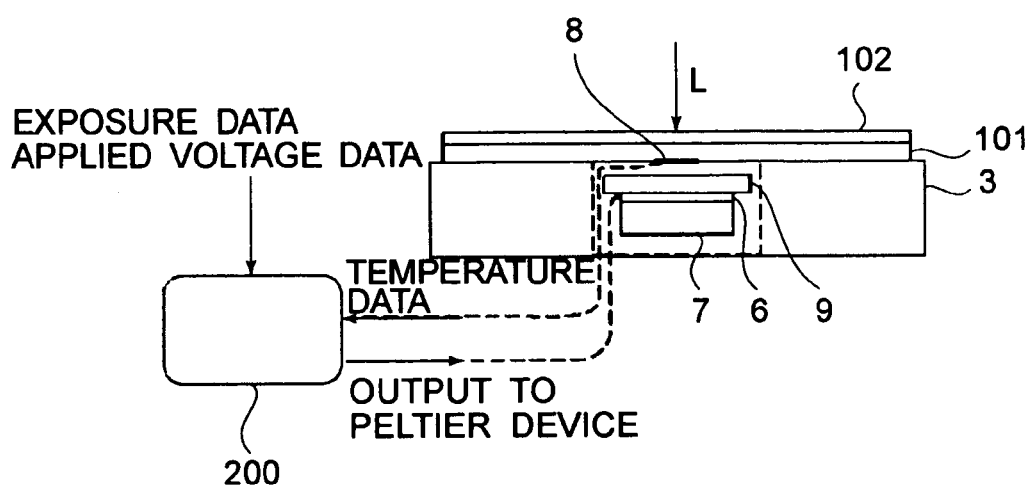
FIG. 7 is a schematic view for explaining a radiation cooling mechanism for a wafer and a temperature controller, in an embodiment of the present invention.
Figure 7A:
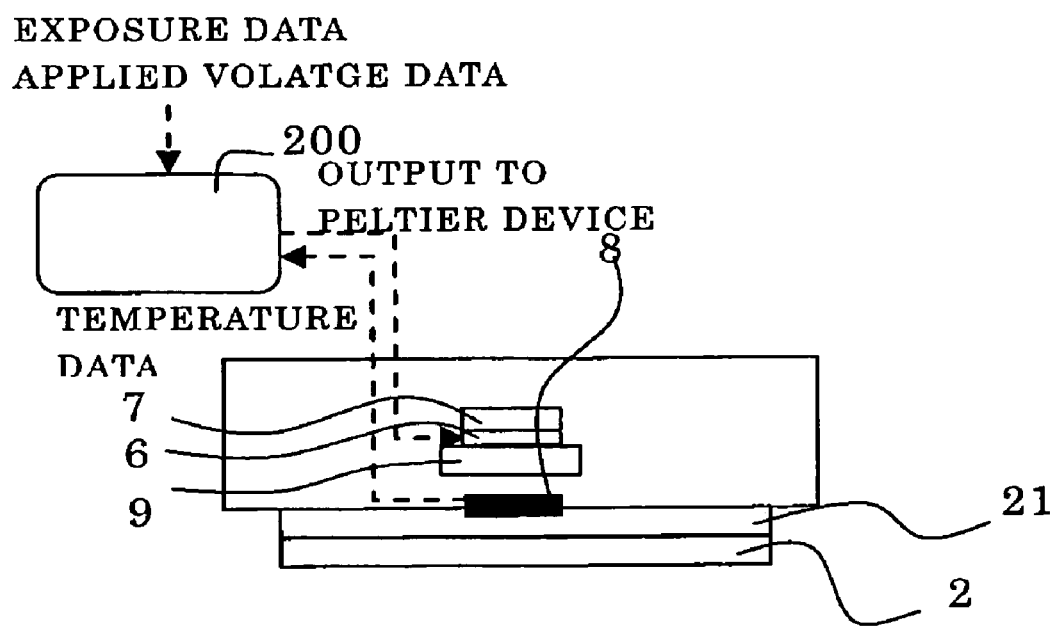
FIG. 7a is a schematic view for explaining a radiation cooling mechanism for a reticle and a temperature controller, in an embodiment of the present invention.

A third embodiment of the present invention is directed to a cooling method wherein the present invention is applied to a process for cooling a wafer chuck, not a mirror, as shown in FIG. 7.

Denoted in FIG. 7 at 102 is a wafer, and denoted at 101 is a wafer chuck. Denoted at 9 is a radiation cooling plate, and denoted at 6 is a Peltier device. Since any thermal deformation of the wafer chuck 101 directly leads to deformation of a wafer 102, it is very important for improvements of pattern transfer precision of an exposure apparatus to suppress temperature variation of the wafer chuck 101. The wafer chuck 101 is made of a material having a high specific rigidity, such as SiC, for example, so as to suppress deformation due to any external force.

Here, for better performance of a wafer stage (lightness or rigidity, for example), the material of the wafer chuck should desirably have a specific rigidity of $1E+8$ (N·m/kg) or more.

Further, in order that the wafer chuck can be used as a radiation plate (radiation member) to perform radiation cooling, it should desirably have a radiation coefficient of 0.4 or more and a thermal conductivity of 30 (W/m/° C.) or more.

Furthermore, in order that the wafer chuck can function as an electrostatic chuck for fixation of a wafer, at least a portion of the chuck (e.g. attracting surface thereof) should desirably have a dielectric constant (relative permittivity) of 10 or more and a volume specific resistance in a range of 1E+6 to 1E+13 (Q·cm).

An example of materials satisfying the above-described conditions and being desirable as an electrostatic chuck that can be radiation-cooled in a vacuum ambience, is SiC. However, any other materials may be used, and alumina may be used, for example. A material that does not satisfy all the conditions described above but satisfies at least two conditions, preferably three or more conditions, may be used.

An electric voltage is applied to the wafer chuck 101 when it attracts a wafer 102. Thus, due to self heat generation, a temperature rise occurs at the wafer chuck 101. Additionally, as the exposure light L is projected to the wafer 102, heat flows from the wafer 102 to the wafer chuck 101, and this causes temperature rise in the wafer chuck 101. In order to suppress these temperature rises, the temperature is measured by the temperature sensor 8, and the temperature controller 200 controls the temperature of the radiation cooling plate 9 so that the temperature to be measured at the temperature sensor becomes constant. Further, the temperature controller 200 can access the information regarding the timing for applying an electric voltage to the wafer chuck and the timing for projecting the exposure light to the wafer 102.

The linear expansion coefficient of the wafer chuck 101 is about 3 ppm, and the temperature control precision is very strict as of an order of ±0.003° C. As described hereinbefore, where the heat load changes as like an on/off operation and if the temperature control delays, it becomes impossible to attain the temperature control precision that satisfies the specification. In consideration of this, the timing for applying an applied electric voltage to the wafer chuck 101 as well as the timing for projecting exposure light to the wafer 102 are predetected, so that the temperature of the radiation plate is controlled before the heat load is applied (on/off) to the wafer chuck. With this procedure, the temperature control precision for the wafer chuck 101 can be ±0.003° C.

In the third embodiment described above, the invention is applied to the wafer chuck for holding a wafer, to cool the wafer chuck. However, the invention is not limited to this. As shown in FIG. 7, the The present invention may be applied to a reticle chuck 21 for holding a reticle 2, to accomplish holding and cooling in a similar manner as the third embodiment. In that occasion, different radiation plates may be provided and disposed opposed to different regions, that is, a region where absorption of light is relatively large and a region where absorption of light is relatively small, respectively, and these radiation plates may be controlled at different temperatures.

As a matter of course, also in the first and second embodiments, a plurality of radiation plates (radiation members) may be provided in different groups, and the different groups may be controlled at different temperatures, respectively.

Fourth Embodiment

Next, referring to FIGS. 8 and 9, an embodiment (fourth embodiment) of a device manufacturing method which uses an exposure apparatus described above, will be explained.

Figure 8:
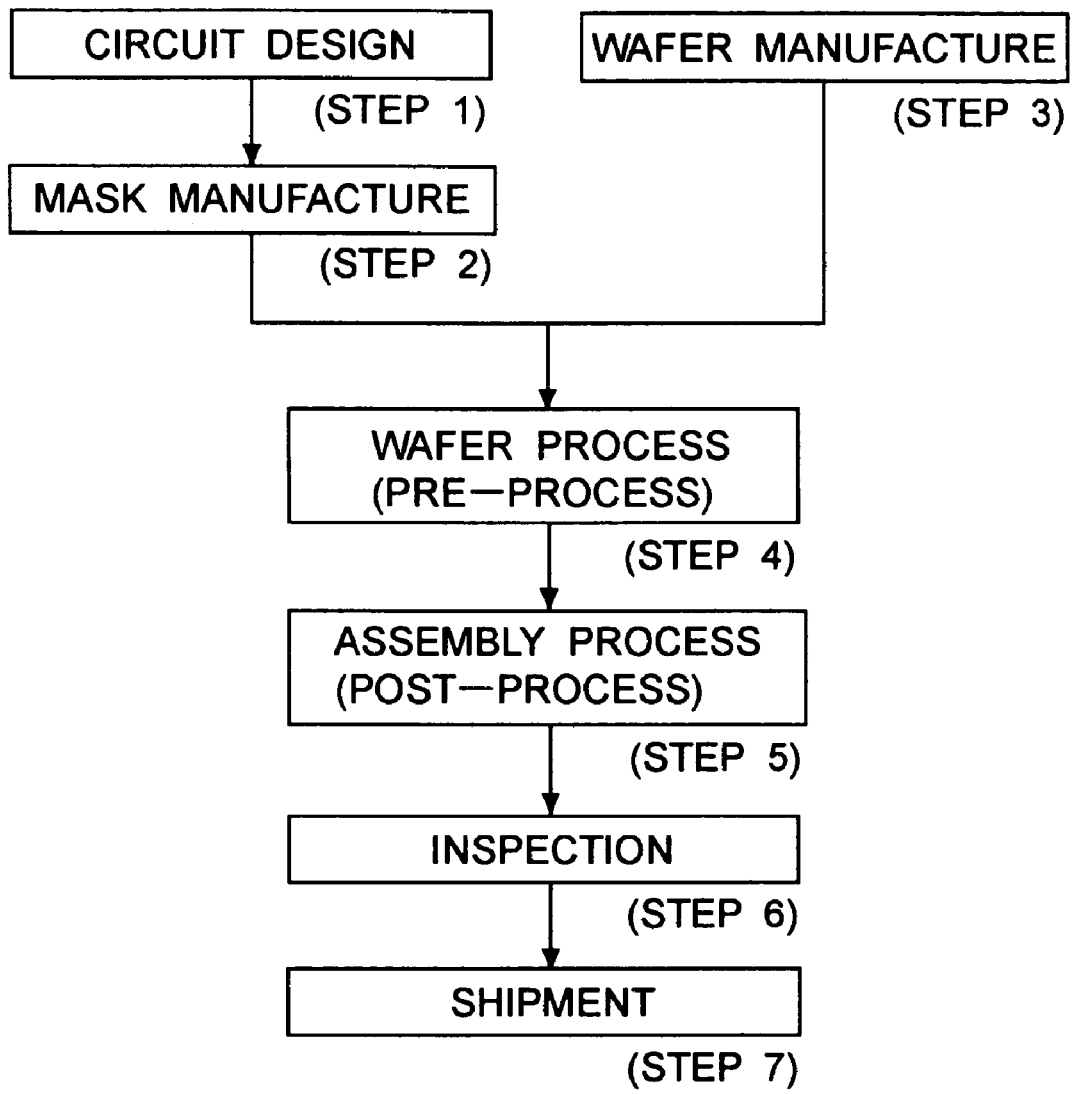
FIG. 8 is a flow chart for explaining manufacture of microdevices such as semiconductor chips (IC or LSI), LCD, and CCD, for example.

FIG. 8 is a flow chart for explaining the procedure of manufacturing various microdevices such as semiconductor chips (e.g., ICs or LSIs), liquid crystal panels, or CCDs, for example. Here, manufacture of semiconductor chips will be explained. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 9:
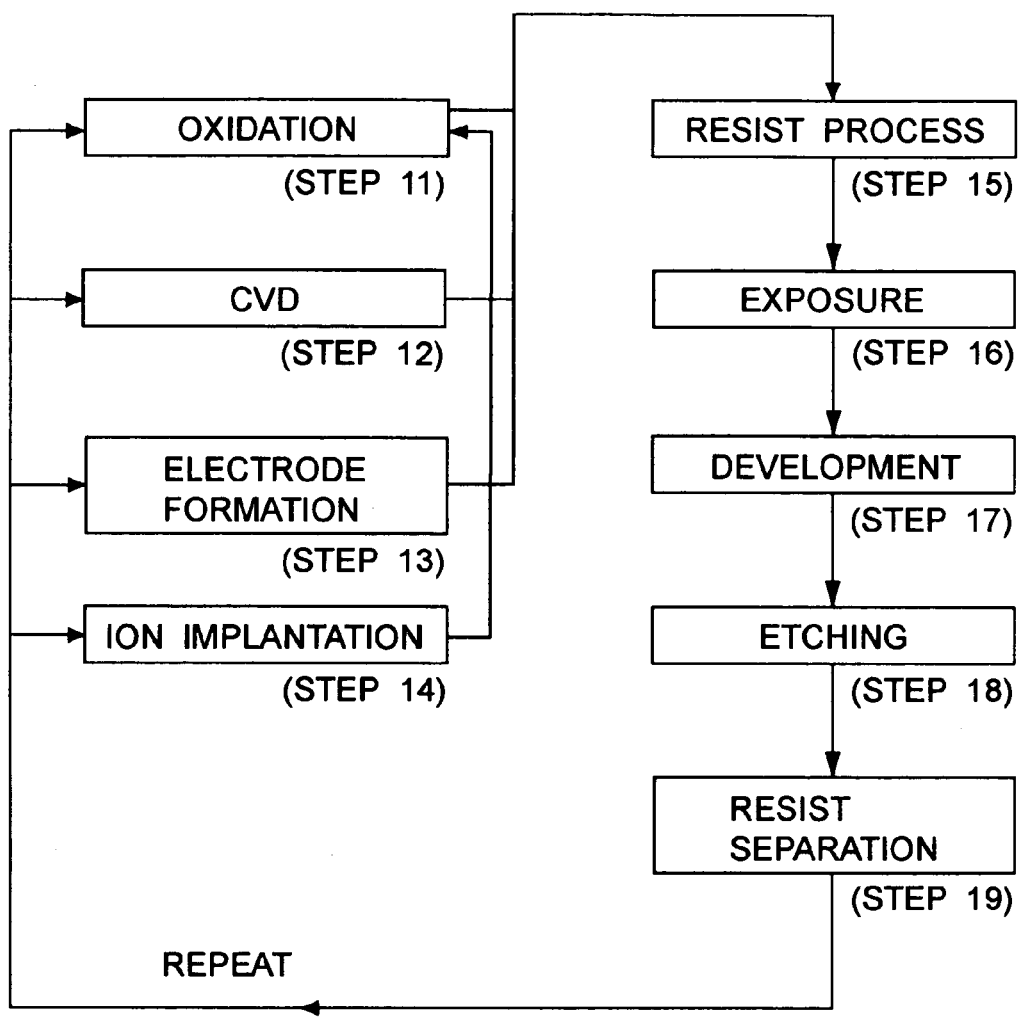
FIG. 9 is a flow chart for explaining details of a wafer process at step 4 in FIG. 8.

FIG. 9 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer. With these processes, high quality microdevices can be manufactured.

As described, a device manufacturing method that uses an exposure apparatus as well as a device as a product thereof are also in the scope of the present invention.

The first to fourth embodiments of the present invention described hereinbefore may be combined in any way as long as it does not cause contradiction. Further, as a matter of course, the invention is not limited to the form of these embodiments, and many changes and deformations are possible within the scope of the invention.

In some aspects, the present invention can be summarized as exemplary forms, as follows.

[Item 1] A cooling method for cooling at [east one optical member disposed in a vacuum ambience, characterized by a detecting step for detecting a temperature of the optical member, and a temperature adjusting step for providing a temperature difference between the optical member and a radiation plate disposed opposed to the optical member without contact thereto, to bring the temperature of the optical member into a predetermined range, on the basis of a result of detection made at the detecting step, wherein the temperature difference between the optical member and the radiation plate is changed before a heat quantity applied to the optical member changes.

[Item 2] A cooling method according to Item 1, wherein, in the temperature adjusting step, the temperature of the radiation plate is adjusted.

[Item 3] A cooling method according to Item 1 or 2, wherein, in the detecting step, the temperature of the optical member is detected by use of a temperature detector which is out of contact to the optical member.

[Item 4] A cooling method according to any one of Items 1-3, wherein, where different optical members are to be cooled, in the temperature adjusting step, at least one of (i) the timing for changing the temperature difference between the radiation plate and the optical member and (ii) the amount of temperature difference between the radiation plate and the optical member, is made different between them.

[Item 5] A cooling method according to any one of Items 1-4, wherein the optical member is a mirror.

[Item 6] A cooling system for cooling at least one optical member disposed in a vacuum ambience, characterized by a detecting device for detecting a temperature of the optical member, and a temperature adjusting device for providing a temperature difference between the optical member and a radiation plate disposed opposed to the optical member without contact thereto, to bring the temperature of the optical member into a predetermined range, on the basis of a result of detection made at the detecting step, wherein the temperature difference between the optical member and the radiation plate is changed before a heat quantity applied to the optical member changes.

[Item 7] A cooling system according to Item 6, wherein the temperature adjusting device adjusts the temperature of the radiation plate.

[Item 8] A cooling system according to Item 6 or 7, wherein the detecting device detects the temperature of the optical member by use of a temperature detector which is out of contact to the optical member.

[Item 9] A cooling method according to any one of Items 6-8, wherein, where different optical members are to be cooled, the temperature adjusting device functions so that at least one of (i) the timing for changing the temperature difference between the radiation plate and the optical member and (ii) the amount of temperature difference between the radiation plate and the optical member, is made different between them.

[Item 10] A cooling system according to any one of Items 6-9, wherein the optical member is a mirror.

[Item 11] An exposure apparatus including at least one optical member and a cooling system according to any one of Items 6-10, for cooling the at least one optical member, wherein a member to be exposed is exposed with light coming from the at least one optical member.

[Item 12] An exposure apparatus according to Item 11, wherein the exposure apparatus includes storing means for storing an exposure program, wherein temperature control of the optical member through the temperature adjusting device is performed on the basis of information from said storing means.

[Item 13] A device manufacturing method characterized by a step for exposing a member to be exposed, by use of an exposure apparatus according to Item 11 or 12, and a step for developing the exposed member.

[Item 14] A cooling method for cooling a plurality of optical members disposed in a vacuum ambience, characterized by a detecting step for detecting a temperature of the optical member, and a temperature adjusting step for providing a temperature difference between the optical member and a radiation plate disposed opposed to the optical member without contact thereto, to bring the temperature of the optical member into a predetermined range, on the basis of a result of detection made at the detecting step, wherein the temperature difference between the optical member and the radiation plate is changed before a heat quantity applied to the optical member changes.

[Item 15] A cooling method according to Item 14, wherein at least one of (i) the timing for changing the temperature difference with the radiation plate and (ii) the amount of temperature difference, is made different with reference to each of the optical members.

[Item 16] A cooling method according to Item 14 or 15, wherein the optical member is a mirror.

[Item 17] An exposure apparatus including a chamber having an inside space filled with a vacuum ambience; a subject member disposed in said inside space, said subject member being a member to be temperature-adjusted; a radiation member for temperature-adjusting the subject member without contact thereto; and a temperature adjusting mechanism for temperature-adjusting the radiation member, characterized in that said temperature adjusting mechanism changes the temperature of the radiation member before a heat quantity applied or to be applied to the subject member changes.

[Item 18] An exposure apparatus according to Item 17, for illuminating a pattern of a reticle with exposure light from a light source and for projecting the exposure light from the reticle to a substrate to be exposed, wherein the subject member to be temperature-adjusted includes at least one of (i) a member placed on a light path of the exposure light, (ii) a member in contact with a member placed on a light path of the exposure light, and (iii) a member holding a member placed in a path of the exposure light, all being disposed within said chamber.

[Item 19] An exposure apparatus according to Item 17 or 18, for projecting a pattern of a reticle onto a substrate for exposure of the same, wherein the subject member to be temperature-adjusted includes a reticle chuck for holding the reticle.

[Item 20] An exposure apparatus according to any one of Items 17-19, for projecting a pattern of a reticle onto a substrate for exposure of the same, wherein the subject member to be temperature-adjusted includes a wafer chuck for holding the substrate to be exposed.

[Item 21] An exposure apparatus according to Item 19 or 20, wherein the reticle chuck and/or the wafer chuck has a specific rigidity not less than 1E+8 (N·m/kg).

[Item 22] An exposure apparatus according to any one of Items 19-21, wherein the reticle chuck and/or the wafer chuck has a radiation coefficient not less than 0.4.

[Item 23] An exposure apparatus according to any one of Items 19-22, wherein the reticle chuck and/or the wafer chuck has a thermal conductivity not less than 30 (W/m/° C.).

[Item 24] An exposure apparatus according to any one of Items 19-23, wherein at least a portion of the wafer chuck has a dielectric constant not less than 10.

[Item 25] An exposure apparatus according to any one of Items 19-24, wherein the wafer chuck has a volume specific resistance in a range from 1E+6 to 1E+13 (Ω·cm).

[Item 26] An exposure apparatus according to any one of Items 17-25, wherein a pattern of a reticle is projected to a substrate to be exposed, by use of at least one optical member, and wherein the subject member to be temperature-adjusted includes the at least one optical member.

[Item 27] An exposure apparatus according to Item 26, wherein the at least one optical member is a reflection member.

[Item 28] An exposure apparatus according to Item 26 or 27, further comprising a first optical member, a second optical member, a first temperature adjusting member for temperature-adjusting the first optical member and a second temperature adjusting member for temperature-adjusting the second optical member, wherein said first and second temperature adjusting members have different temperatures.

[Item 29] An exposure apparatus according to any one of Items 26-28, further comprising a first optical member, a second optical member, a first temperature adjusting member for temperature-adjusting the first optical member and a second temperature adjusting member for temperature-adjusting the second optical member, wherein temperatures of said first and second temperature adjusting members are changed at different timings.

[Item 30] An exposure apparatus according to any one of Items 17-29, wherein the exposure apparatus determines the timing for changing the temperature of the radiation member in accordance with an exposure program.

[Item 31] An exposure apparatus according to any one of Items 17-30, further comprising a temperature sensor for measuring a temperature of the subject member to be temperature-adjusted, wherein the temperature of the temperature adjusting member is adjusted on the basis of an output of said temperature sensor.

[Item 32] A device manufacturing method, comprising the steps of: exposing a substrate to be exposed, by use of an exposure apparatus according to any one of Items 17-31; and developing the exposed substrate.

In accordance with the features of Item 14, when exposure light is projected to the optical member and heat load is applied thereto, the temperature of the optical member would otherwise rise beyond a tolerable range due to control delay. When the exposure is turned off and the heat load disappears, the temperature of the optical member would otherwise fall beyond the tolerable range due to control delay. However, since the timing of exposure ("on") is predetected, a signal for lowering the temperature of the radiation plate is applied beforehand to decrease its temperature, before the temperature of the optical member rises in response to application of the heat load. This effectively reduces temperature variation, and the temperature changes of the optical member can be suppressed within the tolerable range. On the other hand, when the exposure is turned off, a signal for increasing the temperature of the radiation plate is applied beforehand to raise its temperature, so that the temperature changes of the optical member can be suppressed within the tolerable range.

In the cooling method described above, generally, if the optical members have different shapes and the heat load is different, the thermal transfer characteristics are different. Therefore, the timing for applying a signal for changing the temperature of the radiation plate as well as the amount of changing the radiation plate temperature are important factors to be considered. It is therefore necessary to apply a signal for changing the radiation plate temperature by an optimum amount and a timing best suited for the optical member. In the cooling method according to Item 15, where heat load is applied to plural optical members, in regard to each of radiation plates provided in association with plural optical members, the timing of changing the temperature and the amount of changing the temperature can be determined, and a signal for changing the radiation plate temperature can be applied in accordance with the determined timing and amount. Therefore, even if the optical members have different shapes and materials, signals for decreasing the temperatures of the radiation plates can be applied at timings best suited to the optical members, respectively, and thus the temperature changes of all the optical members can be suppressed within the tolerable range.

In accordance with Item 16, thermal distortion of the mirror can be prevented effectively and, therefore, the transfer positional precision can be improved significantly.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
   a chamber having an inside space filled with a vacuum ambience;
   a optical system disposed in said inside space, said optical system including a first optical member and a second optical member;
   a first radiation member for temperature-adjusting the first optical member without contact thereto;
   a second radiation member for temperature-adjusting the second optical member without contact thereto; and
   a temperature adjusting mechanism for temperature-adjusting the first and second radiation members, said temperature adjusting mechanism including a controller with access to data related to a heat quantity applied to the first and second optical members,
   wherein said temperature adjusting mechanism is operable to change, at different timings, the temperatures of the first and second radiation members on the basis of the data before a heat quantity applied to the first and second optical members change.

2. An apparatus according to claim 1, wherein each of the first and second optical members is a reflection member.

3. An apparatus according to claim 1, wherein the controller determines the timings for respectively changing the temperatures of the first and second radiation members on the basis of the data.

4. An apparatus according to claim 1, further comprising a first temperature sensor for measuring a temperature of the first optical member to be temperature-adjusted and a second temperature sensor for measuring a temperature of the second optical member to be temperature adjusted, wherein the temperature of the first radiation member is adjusted on the basis of an output of said first temperature sensor and the temperature of the second radiation member is adjusted on the basis of an output of said second temperature sensor.

5. A device manufacturing method, comprising the steps of: exposing a substrate to be exposed, by use of an exposure apparatus as recited in claim 1; and developing the exposed substrate.

6. An apparatus according to claim 1, wherein the data includes exposure timing and exposure light strength.

* * * * *

UNITED STATES PATENT AND TRADEMARK OFFICE
CERTIFICATE OF CORRECTION

PATENT NO. : 7,295,282 B2 Page 1 of 1
APPLICATION NO. : 10/779034
DATED : November 13, 2007
INVENTOR(S) : Nanba It is certified that error appears in the above-identified patent and that said Letters Patent is hereby corrected as shown below:

In Column 12, Line 21, change "a" to --an--.

Signed and Sealed this

Fifteenth Day of April, 2008

JON W. DUDAS
*Director of the United States Patent and Trademark Office*